United States Patent [19]

Szydlo et al.

[11] Patent Number: 4,685,195

[45] Date of Patent: Aug. 11, 1987

[54] METHOD FOR THE MANUFACTURE OF AT LEAST ONE THIN FILM FIELD EFFECT TRANSISTOR

[75] Inventors: Nicolas Szydlo, Limours; Francois Boulitrop, Sceaux, both of France

[73] Assignee: Thomson-CSF, Paris, France

[21] Appl. No.: 743,608

[22] Filed: Jun. 11, 1985

[30] Foreign Application Priority Data

Jun. 14, 1984 [FR] France .................. 84 09310

[51] Int. Cl.$^4$ .................. H01L 21/00; H01L 29/78
[52] U.S. Cl. .................. 437/41; 357/23.7; 357/30; 437/2; 437/20
[58] Field of Search .................. 29/571, 576 B, 591; 148/1.5, DIG. 51; 156/643, 649, 662; 357/23.7, 56; 427/86, 93

[56] References Cited

U.S. PATENT DOCUMENTS

| | | | |
|---|---|---|---|
| 4,174,217 | 11/1979 | Flatley | 96/36.2 |
| 4,393,572 | 7/1983 | Policastro et al. | 29/571 |
| 4,532,698 | 8/1985 | Fang et al. | 29/571 |
| 4,542,577 | 9/1985 | Jackson | 29/571 |
| 4,551,905 | 11/1985 | Chao et al. | 29/571 |

FOREIGN PATENT DOCUMENTS 90661 10/1983 European Pat. Off. .

OTHER PUBLICATIONS

J. Vac. Sci. Technol. 19(3) Sep./Oct. 1981, pp. 693-695 (Speidell).

Primary Examiner—Brian E. Hearn
Assistant Examiner—Chi Tso Huang
Attorney, Agent, or Firm—Oblon, Fisher, Spivak, McClelland & Maier

[57] ABSTRACT

The invention relates to a method for the manufacture of thin film field effect transistors of the type having self-alignment of the electrodes and obtained on an insulating substrate.

The method comprises two constructional variants making it possible to produce a submicron gate electrode determining a minimum channel length.

The invention is applicable to the field of large surface or area microelectronics and in particular to the control and addressing of a flat liquid crystal screen or an image sensor.

14 Claims, 19 Drawing Figures

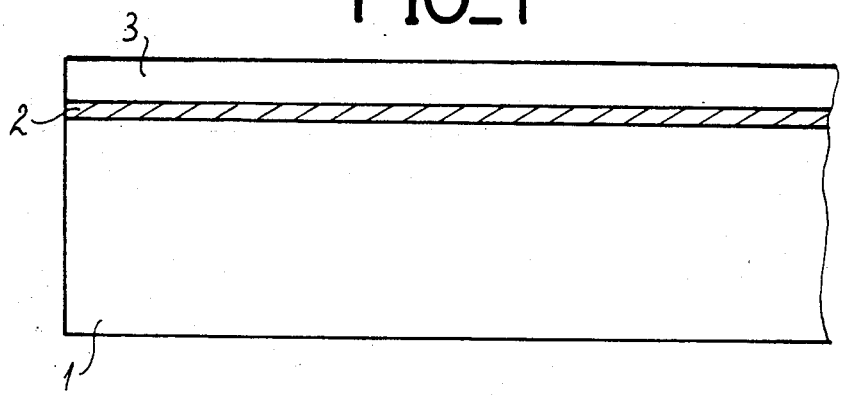
FIG_1
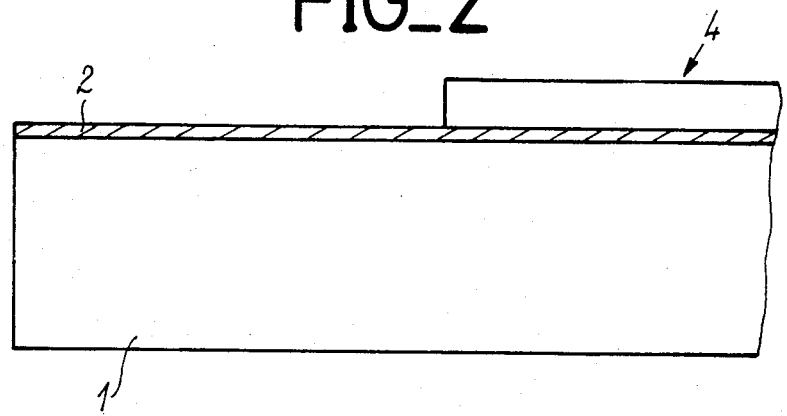
FIG_2
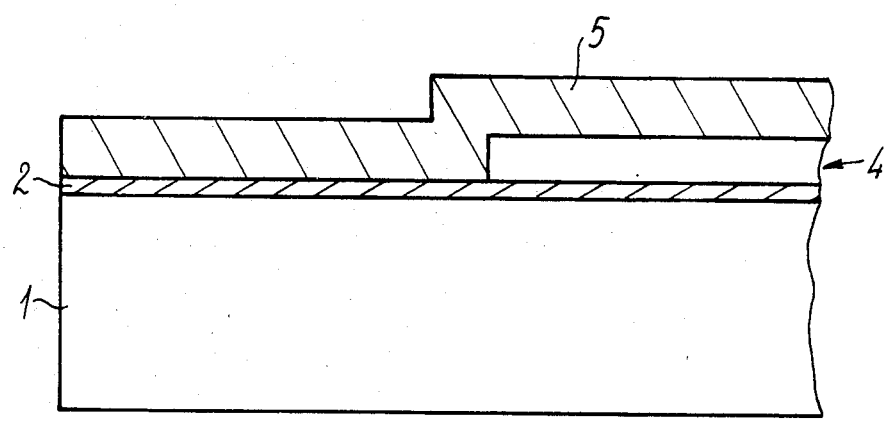
FIG_3

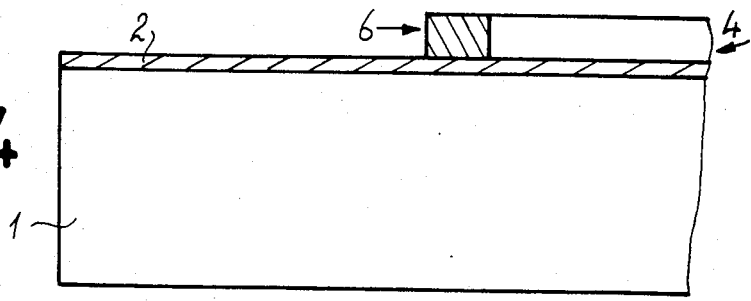
FIG_4
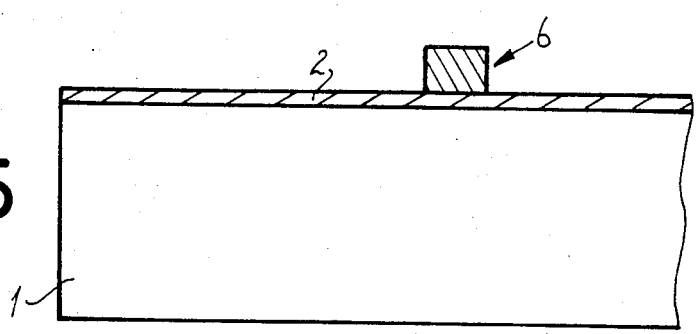
FIG_5
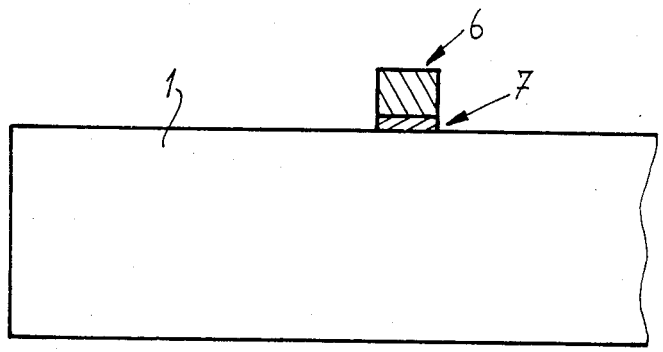
FIG_6
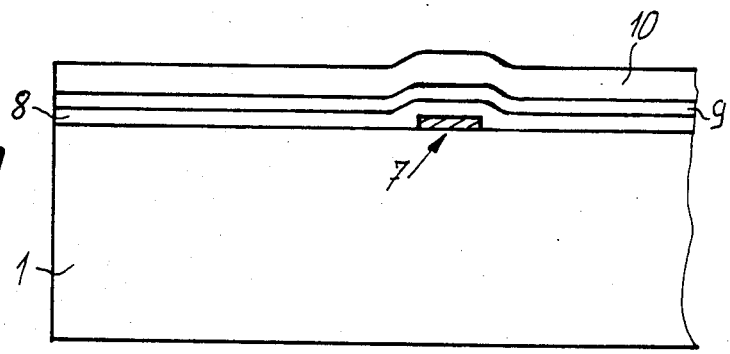
FIG_7

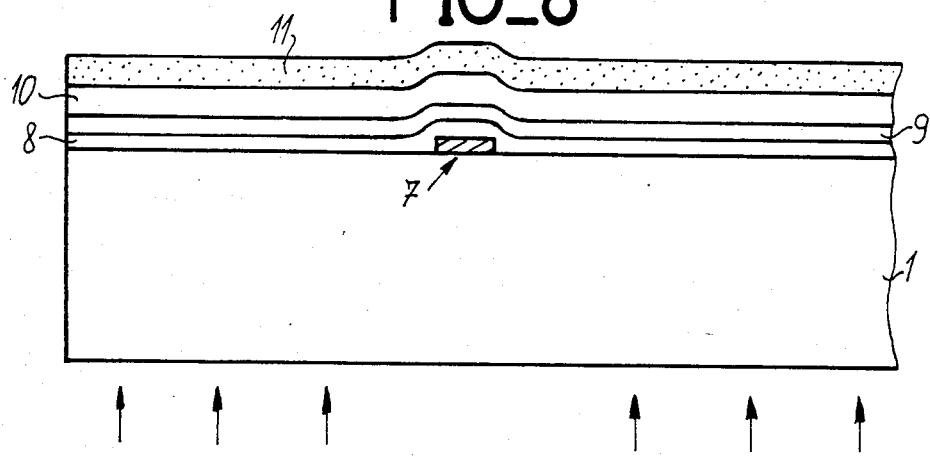
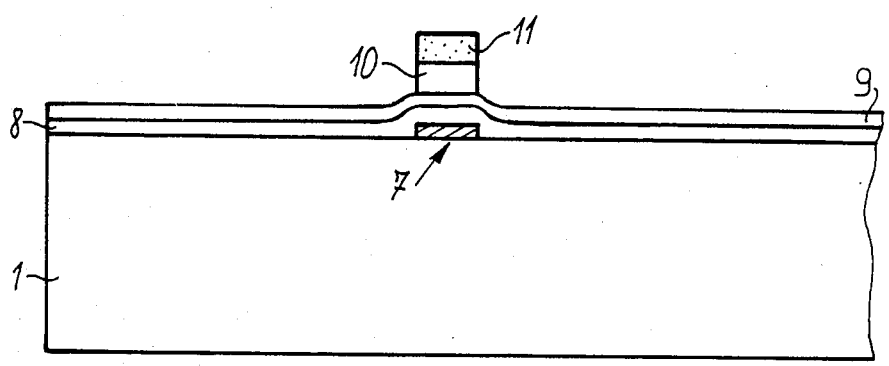
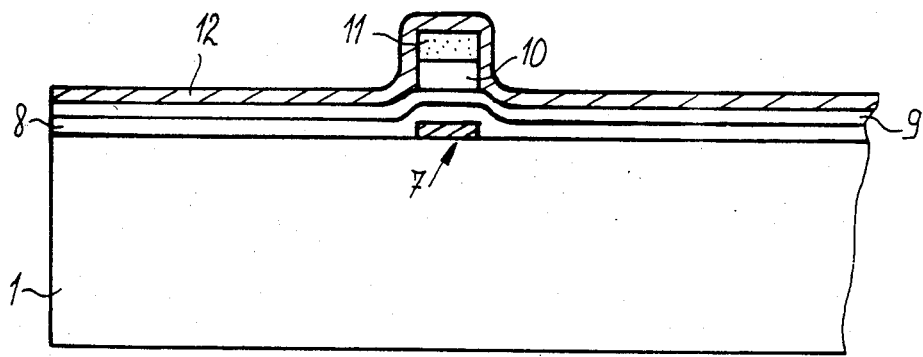

FIG_11
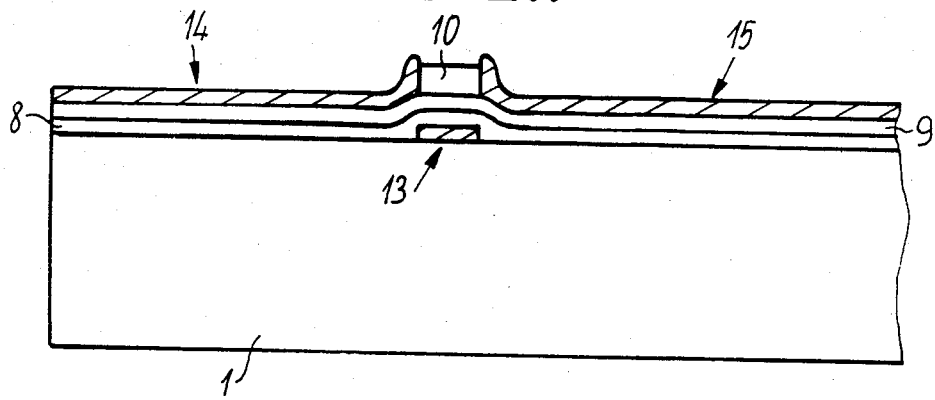
FIG_12
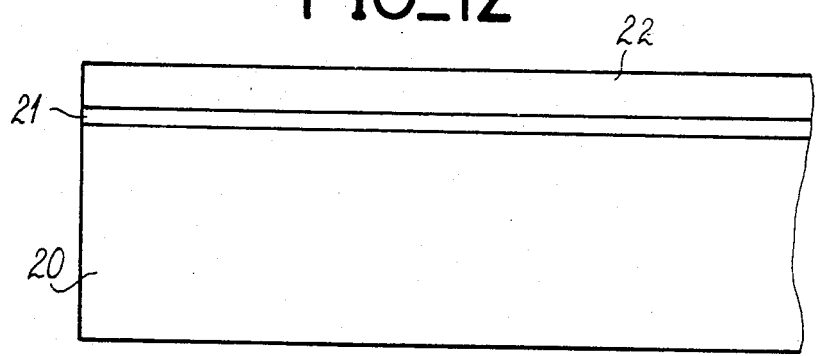
FIG_13
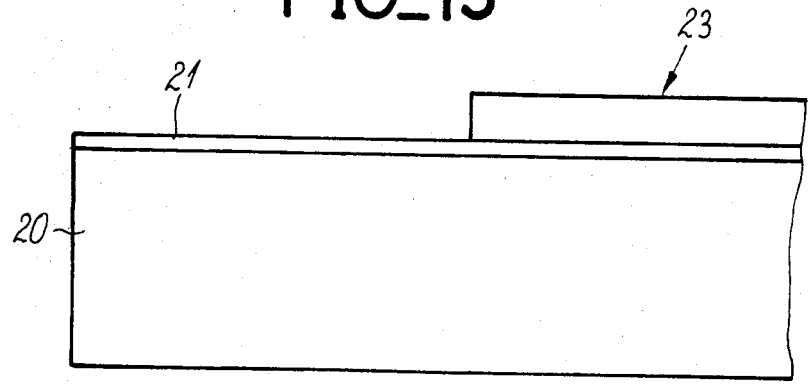

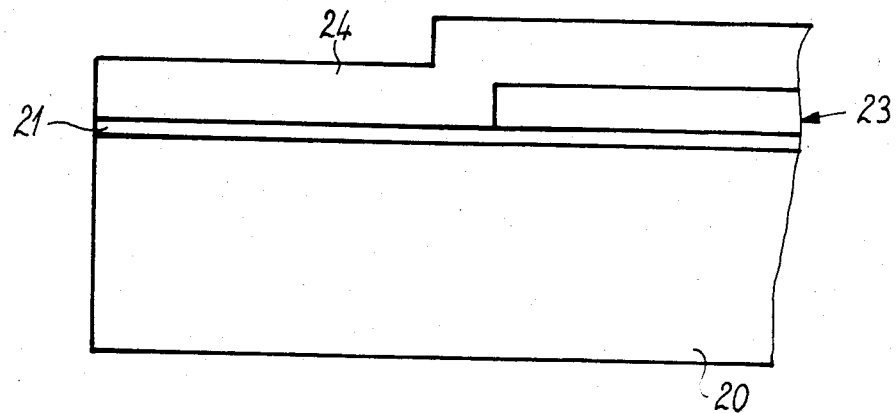
FIG_14
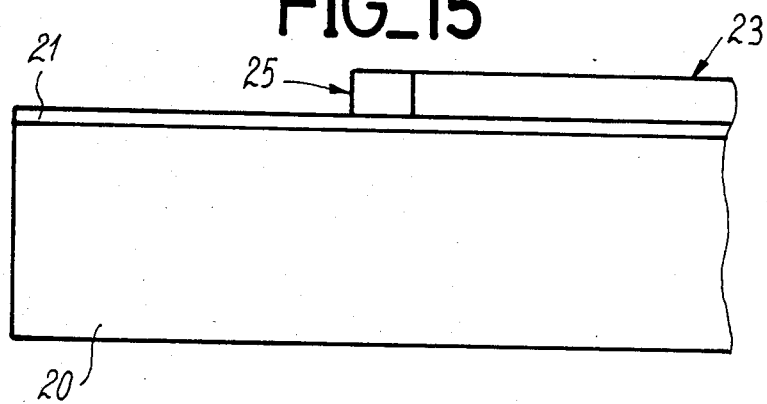
FIG_15
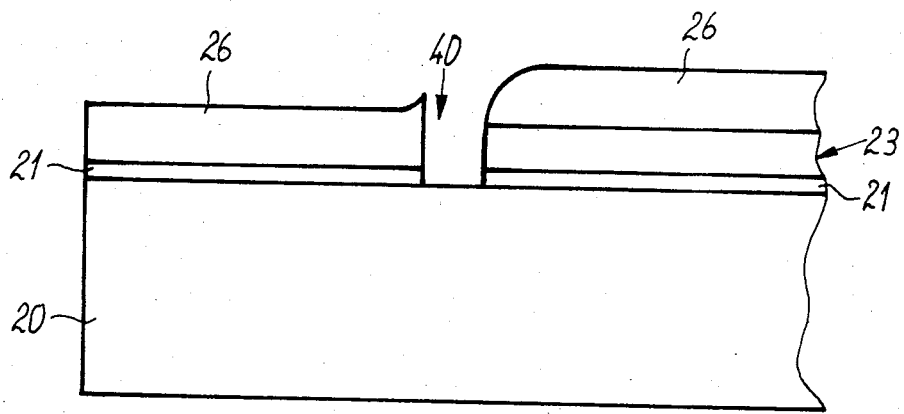
FIG_16

FIG_17
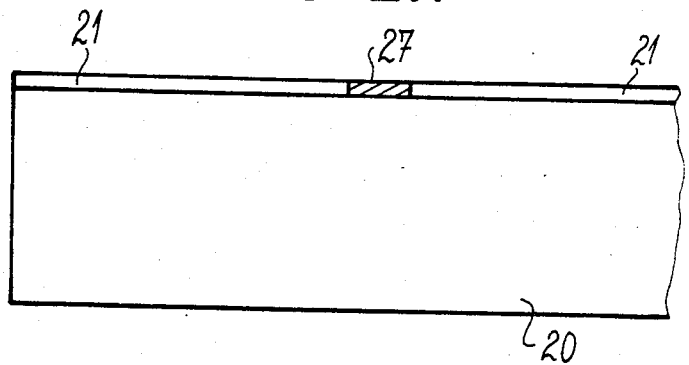
FIG_18
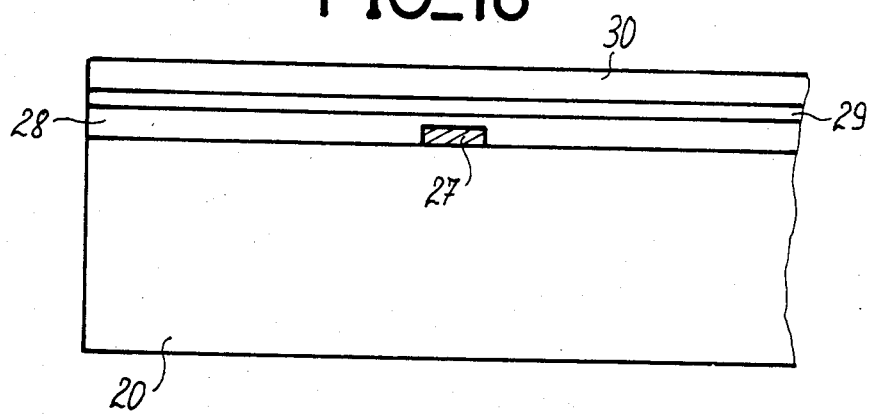
FIG_19
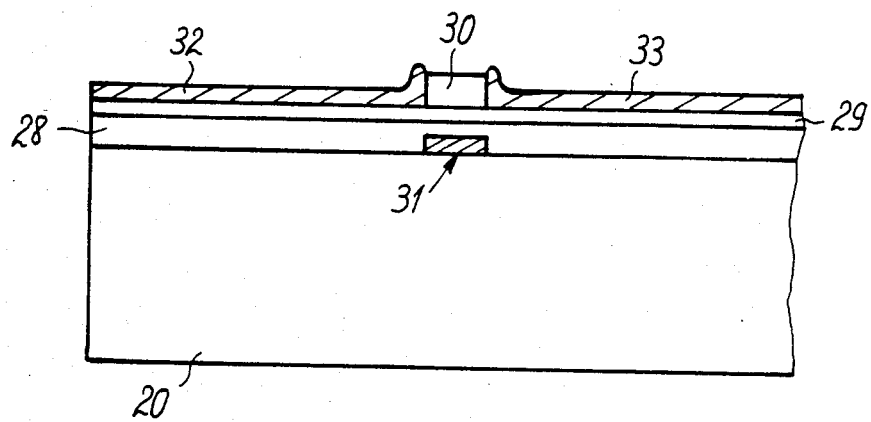

METHOD FOR THE MANUFACTURE OF AT LEAST ONE THIN FILM FIELD EFFECT TRANSISTOR

BACKGROUND OF THE INVENTION

The present invention relates to a method for the manufacture of a thin film field effect transistor of the type with self-alignment of the electrodes. This method applies to the large surface or area microelectronics field and in particular to the control and addressing of a liquid crystal flat screen or an image sensor. It can also be used in the production of rapid switching devices for integration on large surfaces.

Thin film silicon is at present the most widely developed method used for large surface electronic devices. The silicon is then used in amorphous or polycrystalline form. Most research carried out at present deals with the thin film MISFET transistor. For large surface applications, it is necessary for the thin film transistors (TFT) to have minimum response time. In the case of amorphous silicon, whose limited carrier mobility is known, the working frequencies are presently limited to a few hundred kHz. Moreover, when using this material, the saturation currents are low, so that the application of such transistors remains limited to the point-by-point addressing of a liquid crystal screen. For applications such as the peripheral control of a display screen or a shift register, higher working frequencies are required, as are higher saturation currents. In order to achieve these results, it is necessary to surmount certain technical constraints. The channel lengths must be reduced to the minimum, in order to minimize the transit time and the trapping of carriers. Particularly in the case of amorphous silicon, it is preferable to choose large channel widths in order to obtain high saturation currents. The thin film semiconductor and the gate insulant must be consecutively deposited and in the same deposition device, in order to preserve a good quality of the semiconductor - insulant interface. It is necessary to have good source and drain contacts. In the case of thin film devices produced on large surfaces, it is often indispensable to use an electrode self-alignment technology.

The presently developed transistors of the TFT type have a channel length of approximately 10 $\mu$m, with or without self-alignment of the source and drain electrodes with respect to the gate. Smaller channel lengths have been obtained. In decreasing order, reference can be made to 8 $\mu$m for a channel width W of 100 $\mu$m (Y. OKUBO et al, SID 82 Digest, p. 40), 7 $\mu$m for W=45 $\mu$m (M. YAMANO et al, Japan Display 83, p. 356), said two transistors being intended for the matrix addressing of a liquid crystal screen. Reference can also be made to a transistor with a 3 $\mu$m channel length and intended for an image sensor (A. J. SNELL et al, Journal of Non-Crystl.Sol. 59 and 60, 1983, p. 1211). In these three cases, the transistors have been produced with a gate below using conventional photolithography processes.

In conventional photogravure production processes the widths of the channels are dependent on their lengths. The greatest width obtained is approximately 1500 $\mu$m for a length of 10 $\mu$m (K. SUZUKI et al, SID 83 Digest, p. 146). Widths between 100 and 400 $\mu$m are encountered in the case of amorphous silicon. Beyond this, technical difficulties occur which are linked with the actual procedure, such as resolution of the masks and alignment machines, superimposing, definition of etching action etc.

In order to obviate these disadvantages, the present invention proposes a method for the collective manufacture of transistors of the TFT type with a submicron gate self-aligned with the source and drain. Typically, the channel length will be between 0.5 and 1 $\mu$m. Such an amorphous silicon transistor permits use up to frequencies of a few dozen megahertz. If the transistor is made from polycrystalline silicon, the maximum frequency of use can be extended to a few hundred megahertz. This type of transistor is used in faster large surface electronics.

BRIEF SUMMARY OF THE INVENTION

The present invention therefore relates to a method for the manufacture of at least one thin film field effect transistor of the type having self-alignment of the electrodes, the transistor being obtained from successive deposits on a first face of a transparent, insulating substrate, wherein the method comprises the following stages:
- first stage: deposits on the first face of the substrate of a first metal coating and a coating of a first material,
- second stage: formation of a mesa of said first material,
- third stage: deposition of a coating of a second material of given thickness,
- fourth stage: etching said second material so as to only leave a shoulder of the second material on the side or edge of the mesa,
- fifth stage: etching the mesa until it has been completely eliminated,
- sixth stage: etching the first metal coating so as to only leave a metal shoulder protected by the second material shoulder,
- seventh stage: etching the second material shoulder until it has been completely eliminated,
- eighth stage: successive deposits of a grid insulant coating and a coating of a semiconductor material,
- ninth stage: deposit of a photosensitive resin coating, irradiation of the resin from the second face of the substrate and elimination of the irradiated part of the resin,
- tenth stage: formation of source and drain ohmic contacts,
- eleventh stage: deposit of a second metal coating and removal of resin,
- twelfth stage: delimitation of the gate, source and drain electrodes.

The invention also relates to a method for the manufacture of at least one thin film field effect transistor of the type with self-alignment of the electrodes, the transistor being formed from successive deposits on a first face of a transparent, insulating substrate, wherein the method comprises the following stages:
- first stage: deposition on said first face of the substrate of a first insulating coating and a coating of a first material,
- second stage: formation of a mesa of said first material,
- third stage: deposition of a coating of a second material of given thickness,
- fourth stage: etching said second material so as to only leave a shoulder of the second material on the side or edge of the mesa, fifth stage: deposit of a coating of a third material and formation of a hole by removing said shoulder, sixth stage: deepening said hole by etching the first insulating coating down to said first face of the substrate, seventh stage: deposit of a first metal coating and removing the coatings of the first and second materials, eighth stage: successive deposits of a second insulating coating for forming with the first insulating coating the insulating gate coating, as well as a coating of a semiconductor material, ninth stage: deposit of a photosensitive resin coating, irradiation of the resin from the second face of the substrate and elimination of the irradiated part of the resin, tenth stage: formation of ohmic source and drain contact, eleventh stage: deposit of a second metal coating and removal of the resin, twelfth stage: delimitation of the grid, source and drain electrodes.

The invention also relates to the transistor obtained by one of the aforementioned methods.

BRIEF DESCRIPTION OF THE DRAWINGS

The invention is described in greater detail hereinafter relative to non-limitative embodiments and the attached drawings, wherein show:

FIGS. 1 to 11 different stages of a first variant of the manufacturing method according to the invention.

FIGS. 12 to 19 different stages of a second variant of the manufacturing method according to the invention.

DETAILED DESCRIPTION OF THE PREFERRED EMBODIMENTS

In the case of a transistor with a gate below, i.e. in contact with the substrate, two production procedures can be envisaged, as a function of the accuracy required for the self-alignment.

FIGS. 1 to 11 relate to a first constructional variant. FIG. 1 illustrates the first stage of the method. A metal coating 2 for forming the future gate electrode is deposited on a transparent, insulating substrate 1, e.g. of glass. The metal deposited can be aluminium, a nickel - chrome alloy or chrome deposited by a conventional evaporation means. The thickness of coating 2 can be approximately 100 nm. A coating 3 of a first material, which can be silicon dioxide $SiO_2$ with a thickness of approximately 0.5 μm, is deposited on coating 2. During this second stage of the method, coating 3 is etched by conventional photolithographic means, as indicated in FIG. 2, so as to define a mesa 4. As can be seen in FIG. 2, etching is continued until the metal coating 2 is reached. FIG. 2 and the following Figs are partial views. Thus, so as not to overload the drawings, the manufacture of a single transistor only is shown. However, it is obvious that it is possible to manufacture several transistors from a single mesa. The etching of mesa 4 constitutes a first masking level.

The third stage of the method illustrated in FIG. 3 comprises the deposition at a temperature compatible with the substrate, e.g. using the LPCVD method or the luminous discharge method, of a coating 5 of a second material differing from that of coating 3, which can be amorphous or polycrystalline silicon if coating 3 is of $SiO_2$. These methods give a uniform thickness to the deposit, no matter what the angle of the substrate with respect to the intake of the vector gases. The thickness of coating 5 is a function of the desired gate length and is in practice between 0.5 and 1 μm. Coating 5 adapts to the relief constituted by coating 2 and mesa 4. The fourth stage of the method is constituted by the directional etching of coating 5. As is illustrated in FIG. 4, said etching is continued so as to only leave behind from coating 5 the shoulder 6 on the edge or side of mesa 4. Directional etching can be carried out be reactive ion etching (RIE) using a carbon tetrafluoride ($CF_4$) plasma, either alone or assisted by oxygen.

The fifth stage consists of the elimination of the mesa, which can easily be carried out as a result of the selectivity of the etching media. The device obtained after the fifth stage is shown in FIG. 5.

The sixth stage consist of etching the metal coating 2 not protected by shoulder 6. This makes it possible to define the length of the submicron gate materialized by the metal shoulder 7 and as shown in FIG. 6. Chemical etching in the seventh stage eliminates shoulder 6. The future transistor gate is consequently completely metallic and will therefore have a substantially zero electrical resistance. The face of substrate 1 supporting the metal shoulder 7 is then covered, during the eighth stage, with successive deposits constituted by an insulating gate coating 8, a coating of a semiconductor material 9 and optionally a coating of a passivation insulant 10. The gate insulant can be silicon dioxide $SiO_2$ or silicon oxynitride SiON or silicon nitride $Si_3N_4$. The thickness of coating 8 is approximately 0.12 μm. The semiconductor of coating 9 can be of amorphous silicon a-Si or polycrystalline silicon deposited by the LPCVD or luminous discharge procedure. The thickness of coating 9 is approximately 0.1 μm. Coating 10 has a thickness between approximately 0.2 and 0.5 μm and can be of silicon dioxide $SiO_2$. FIG. 7 shows the device obtained at the end of the eighth stage. Coating 8 and the optionally deposited coating 10 are formed from naturally transparent materials. The semiconductor coating 9 must be sufficiently thin to be transparent to the light of an irradiation source.

The ninth stage comprises the deposition of a photosensitive resin coating 11 on the final coating deposited. The resin is then irradiated through the transparent substrate 1, as shown in FIG. 8. It is then developed and all that remains on the device is that part of the resin which is not irradiated, due to the screen constituted by the metal shoulder 7. In the case where a passivation insulating coating 10 has been deposited, the latter is eliminated by chemical etching, with the exception of that part covered by the remainder of the resin. FIG. 9 illustrates the device obtained in this stage.

It is then preferable to have good ohmic source and drain contacts, which can be obtained in different ways. For example, a new deposit can be formed, which is constituted by a n+ doped amorphous silicon coating. It is also possible and this is the case of the proposed application example, to use ion implantation of the semiconductor coating 9 using doping agents, such as phosphorous or arsenic ions. Self-alignment is then carried out as a result of the remaining elements of the passivation insulant and resin coatings 10, 11. Typically, the implanted ion doses are approximately $10^{16}/cm^2$ for an energy ranging between 50 and 250 keV as a function of the semiconductor coating thickness. It is advantageous to proceed with implantation at different energy levels, in order to optimize the distribution of the implanted ions, as a function of the performances required of the transistors. Following ion implantation, annealing is necessary in order to reactivate the implants. The activation of the implants is carried out by annealing under a neutral gas flow at a temperature of approximately 200° to 300° C. The tenth stage of the method is constituted by obtaining ohmic source and drain contacts.

The eleventh stage of the method comprises the deposition of a metal coating 12 for forming the source and drain electrodes. Metal coating 12, e.g. of aluminium and with a thickness of approximately 0.2 μm is deposited by evaporation. FIG. 10 illustrates the device obtained at this stage of the method. The eleventh stage also comprises the lift-off of the residual resin 11, which forms a first delimitation of the source and drain electrodes.

The twelfth stage of the method makes it possible to perfectly delimit the gate, source and drain electrodes 13, 14, 15 respectively. This constitutes a second masking level, which can also be used for producing an overall mesa formed by a transistor. The final device obtained is shown in FIG. 11.

In this small size gate procedure, it must be ensured that excessively thick active and passivating coatings are not deposited, so as to remain compatible with the limit precision of the irradiation source, which is a function of the wavelength used (360 to 420 nm). If coatings 8 and 9 are too thick, diffraction and refraction of the irradiation light can occur, because said coatings have edges which slope with respect to the substrate, due to the thickness of the gate electrode. Such phenomena can have a prejudicial influence on the accuracy imposed with respect to the channel length. A greater accuracy can be obtained by a second constructional variant, which eliminates the aforementioned edges.

The second variation of the manufacturing method is illustrated by FIGS. 12 to 19. FIG. 12 corresponds to the first stage of the method consisting of successively depositing an insulating, transparent substrate 20, a first insulating coating 21 and a coating 22 of a first material differing from insulant 21. Coating 21 has thickness of approximately 100 nm and can be of silicon nitride $Si_3N_4$. Coating 22 can be of silicon dioxide $SiO_2$ and have a thickness of approximately 0.5 μm. Substrate 20 can be of glass.

The second stage of the method illustrated by FIG. 13 comprises, as in the first variant, the etching of coating 22 so as to leave a mesa 23 (first masking level). The third stage is constituted by the deposition of a coating 24 of a second material, as indicated in FIG. 14. This coating covers mesa 23 and the exposed face of coating 21. Coating 24 can be of amorphous silicon and can be deposited by plasma-assisted CVD or PLCVD. Its thickness is dependent on the desired channel length. Typically, the thickness of coating 24 is 0.5 to 1 μm. The fourth stage of the method consists of the directional etching of coating 24. As illustrated in FIG. 15, this etching is carried out, so as to only leave behind from coating 24, the shoulder 25 on the side of mesa 23. As in the first variant of the method, this can consist of RIE etching. In this stage of the method, the device is similar to that obtained at the end of the four stage of the first variant, with the essential difference that the coating directly supported by the substrate is of an insulating nature, instead of being metallic.

The fifth stage comprises the deposition of a coating 26 of a third material differing from the materials of coatings 24 and 21. If coating 21 is of silicon nitride and coating 24 of amorphous silicon, coating 26 can be of silicon dioxide $SiO_2$. As a result of the lift-off of shoulder 25, a submicron hole is obtained corresponding to the location of shoulder 25 and that part of the coating 26 positioned just above said shoulder. The sixth stage consists of deepening the submicron hole obtained in the preceding stage. This can be carried out more easily by plasma etching if coating 21 is of silicon nitride and mesa 23 and coating 26 of silicon dioxide. Etching can be continued until substrate 20 is reached, as is shown in FIG. 16, where the submicron hole carries the reference 40.

The seventh stage of the method comprises the deposition of a metal coating on the device obtained at the end of the sixth stage. This deposit is preferably obtained by the evaporation of a metal, such as aluminium using the Joule effect, in order to prevent the attachment of the metal to the sides of the hole. For example, the quantity of metal necessary for filling that part of hole 40 corresponding to coating 21 is melted. The seventh stage also comprises the lift-off of coatings 23 and 26 which, in the chosen application example, are both of silicon dioxide. The device is then in the form shown in FIG. 17.

The remainder of the operations are identical to those of the first variant corresponding thereto. The eighth stage comprises the successive depositions of an insulating coating, e.g. of $Si_3N_4$ for forming with the insulating coating 21 a common gate insulating coating 28, a coating of a semiconductor material 29 and optionally a coating of a passivation insulant 30. The device obtained is in the form shown in FIG. 18. The semiconductor of coating 29 can be amorphous or polycrystalline silicon. The passivation insulation can be of silicon dioxide $SiO_2$. The thickness of coatings 28, 29 and 30 are of the same order of magnitude as those of the corresponding coatings of the first variant described.

The ninth stage comprises the deposition of a photosensitive resin coating, its irradiation from the second face of the substrate 20 and the elimination of the irradiated part of the resin. In the case where a passivation insulant coating 30 has been deposited, the latter is eliminated by chemical etching, with the exception of that part covered by the remainder of the resin.

The tenth stage comprises the formation of source and drain ohmic contacts in the manner described hereinbefore. The eleventh stage comprises the deposition of a metal coating for forming source and drain electrodes. This coating, with a thickness of approximately 0.2 μm can be deposited by evaporation. This stage also comprises the lift-off of the residual resin, which constitutes a first delimitation of the source and drain electrodes. The twelfth stage of the method makes it possible to perfectly delimit the gate, source and drain electrodes 31, 32, 33 respectively. This operation requires a second masking level, which can also be used for forming an overall mesa constituted by a transistor. The final device obtained is shown in FIG. 19.

The two variants of the method make it possible to manufacture a transistor with a channel having a length between 0.5 and 1 μm and a width of approximately 100 μm.

This submicron gate transistor manufacturing method can be used for transistors in which the gate is positioned above. The initial substrate is no longer simply of glass, but must be covered with a semiconductor coating and an insulating gate coating before applying the metal coating for forming the gate.

What is claimed is:

1. A method for the manufacture of at least one thin film field effect transistor of the type having self-alignment of the electrodes, the transistor being obtained from successive deposits on a first face of a transparent, insulating substrate, wherein the method comprises the following stages:
   first stage: deposits on the first face of the substrate of a first metal coating and a coating of a first material,
   second stage: formation of a mesa of said first material,
   third stage: deposition of a coating of a second material of given thickness,
   fourth stage: etching said second material so as to only leave a first shoulder of the second material on the side or edge of the mesa,
   fifth stage: etching the mesa until it has been completely eliminated,
   sixth stage: etching the first metal coating so as to only leave a second metal shoulder protected by the first shoulder,
   seventh stage: etching the first shoulder until it has been completely eliminated,
   eighth stage: successive deposits of a transparent grid insulant coating and a thin coating of a transparent semiconductor material,
   ninth stage: deposit of a photosensitive resin coating, irradiation of the resin from the second face of the substrate and elimination of the irradiated part of the resin,
   tenth stage: formation of source and drain ohmic regions,
   eleventh stage: deposit of a second metal coating and removal of resin and second metal coating on the resin,
   twelfth stage: delimitation of the gate, source and drain electrodes.

2. A manufacturing method according to claim 1, wherein the first metal coating is an aluminium coating deposited by evaporation.

3. A manufacturing method according to claim 1, wherein the first metal coating is a chromium coating or a nickel-chromium alloy coating deposited by evaporation.

4. A manufacturing method according to claim 1, wherein the first material is silicon dioxide $SiO_2$.

5. A manufacturing method according to claim 1, wherein the second material is of amorphous or polycyrstalline silicon deposited by plasma-assisted CVD or LPCVD.

6. A manufacturing method according to claim 1, wherein the etching of the second material formed during the fourth stage is reactive ion etching (RIE).

7. A maufacturing method according to claim 1, wherein the gate insulant is of silicon dioxide $SiO_2$, silicon oxynitride SiON or silicon nitride $Si_3N_4$.

8. A manufacturing method according to claim 1, wherein the semiconductor material deposited in the eighth stage is of amorphous silicon or polycrystalline silicon.

9. A manufacturing method according to claim 1, wherein the ohmic regions of the tenth stage are obtained by the deposit of n doped semiconductor material.

10. A manufacturing method according to claim 1, wherein the ohmic regions of the tenth stage are obtained by ion implantation followed by annealing.

11. A manufacturing method according to claim 10, wherein implantation of the semiconductor layer is realised by phosphorous or arsenic ions.

12. A manufacturing method according to claim 10, wherein ion implantation is carried out according to different energy levels.

13. A manufacturing method according to claim 1, wherein the second metal coating is of aluminium deposited by evaporation.

14. A manufacturing method according to claim 1, wherein during the eighth stage, a coating of a passivation insulant is deposited on the semiconductor coating and wherein, at the end of the ninth stage, that part of the passivation insulant not protected by the non-irradiated part of the resin is eliminated.

* * * * *